US009472756B2

(12) United States Patent
Ishikawa et al.

(10) Patent No.: US 9,472,756 B2
(45) Date of Patent: Oct. 18, 2016

(54) NONVOLATILE MEMORY DEVICE (71) Applicants: Takayuki Ishikawa, Kanagawa-ken (JP); Yoshifumi Nishi, Aachen (DE); Shosuke Fujii, Kanaga-ken (JP)

(72) Inventors: Takayuki Ishikawa, Kanagawa-ken (JP); Yoshifumi Nishi, Aachen (DE); Shosuke Fujii, Kanaga-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 13/714,946

(22) Filed: Dec. 14, 2012

(65) Prior Publication Data

US 2014/0070160 A1 Mar. 13, 2014

Related U.S. Application Data

(60) Provisional application No. 61/698,019, filed on Sep. 7, 2012.

(51) Int. Cl.
*H01L 27/24* (2006.01)
*H01L 45/00* (2006.01)

(52) U.S. Cl.
CPC ............. *H01L 45/14* (2013.01); *H01L 45/085* (2013.01); *H01L 45/1233* (2013.01); *H01L 45/1266* (2013.01); *H01L 45/145* (2013.01); *H01L 45/148* (2013.01); *H01L 45/165* (2013.01); *H01L 45/1658* (2013.01); *H01L 27/2481* (2013.01)

(58) Field of Classification Search
CPC ............. H01L 27/2481; H01L 45/085; H01L 45/1233; H01L 45/1266; H01L 45/14; H01L 45/145; H01L 45/148; H01L 45/165; H01L 45/1658

See application file for complete search history.

(56) References Cited

U.S. PATENT DOCUMENTS

| 2007/0008773 A1* | 1/2007 | Scheuerlein .................. 365/161 |
|---|---|---|
| 2009/0014707 A1 | 1/2009 | Lu et al. |
| 2011/0068316 A1 | 3/2011 | Takano et al. |
| 2011/0170331 A1* | 7/2011 | Oh et al. ........................ 365/148 |
| 2012/0145987 A1* | 6/2012 | Sei et al. ........................... 257/5 |

OTHER PUBLICATIONS

U.S. Appl. No. 13/598,305, filed Aug. 29, 2012, Shosuke Fujii, et al.
Sung Hyun Jo, et al., "CMOS Compatible Nanoscale Nonvolatile Resistance Switching Memory", Nano Letters, vol. 8, No. 2, 2008, pp. 392-397.
U.S. Appl. No. 14/022,732, filed Sep. 10, 2013, Ishikawa, et al.

* cited by examiner

*Primary Examiner* — Raj R Gupta
(74) *Attorney, Agent, or Firm* — Oblon, McClelland, Maier & Neustadt, L.L.P.

(57) ABSTRACT

According to one embodiment, a nonvolatile memory device includes a first electrode, a second electrode, a variable resistance layer. The variable resistance layer is provided between the first electrode and the second electrode. The variable resistance layer contains impurity of a nonmetallic element. The impurity is at least one selected from the group consisting of S, Se, Te, F, Cl, Br, and I.

15 Claims, 11 Drawing Sheets

NONVOLATILE MEMORY DEVICE

CROSS-REFERENCE TO RELATED APPLICATIONS

This application is based upon and claims the benefit of priority from the prior U.S. Provisional Patent Application 61/698,019, filed on Sep. 7, 2012; the entire contents of which are incorporated herein by reference.

FIELD

Embodiments described herein relate generally to a nonvolatile memory device.

BACKGROUND

Among nonvolatile memory devices, the resistive random access memory (ReRAM) includes a memory element section constituted by a two-terminal structure in which a variable resistance layer is sandwiched between two electrodes. The structure of this memory element section is simple and superior in scalability. Furthermore, the resistive random access memory has a low driving voltage. Thus, the resistive random access memory is expected for applications such as a substitute for the NAND flash memory, which is widely applied to commercial products as a high-capacity semiconductor memory element.

As a material of the variable resistance layer, various substances such as transition metal oxides, sulfides, perovskite oxides, and semiconductors are investigated. Among them, in a nonvolatile memory device, a semiconductor such as amorphous silicon can be used as a material of the variable resistance layer. Such a nonvolatile memory device has a high affinity for the manufacturing process of silicon-based CMOS (complementary metal oxide semiconductor). Furthermore, in this variable resistance layer, the nonvolatile memory operation with low current has been demonstrated.

In such a nonvolatile memory device, improvement of data retention characteristics is important.

BRIEF DESCRIPTION OF THE DRAWINGS

FIGS. 5 to 6B are schematic sectional views illustrating the method for manufacturing a nonvolatile memory device;

DETAILED DESCRIPTION

In general, according to one embodiment, a nonvolatile memory device includes a first electrode, a second electrode, a variable resistance layer. The variable resistance layer is provided between the first electrode and the second electrode. The variable resistance layer contains impurity of a nonmetallic element. The impurity is at least one selected from the group consisting of S, Se, Te, F, Cl, Br, and I.

Various embodiments will be described hereinafter with reference to the accompanying drawings. In the following description, like members are labeled with like reference numerals. The description of the members once described is omitted appropriately.

First Embodiment

Figure 1:
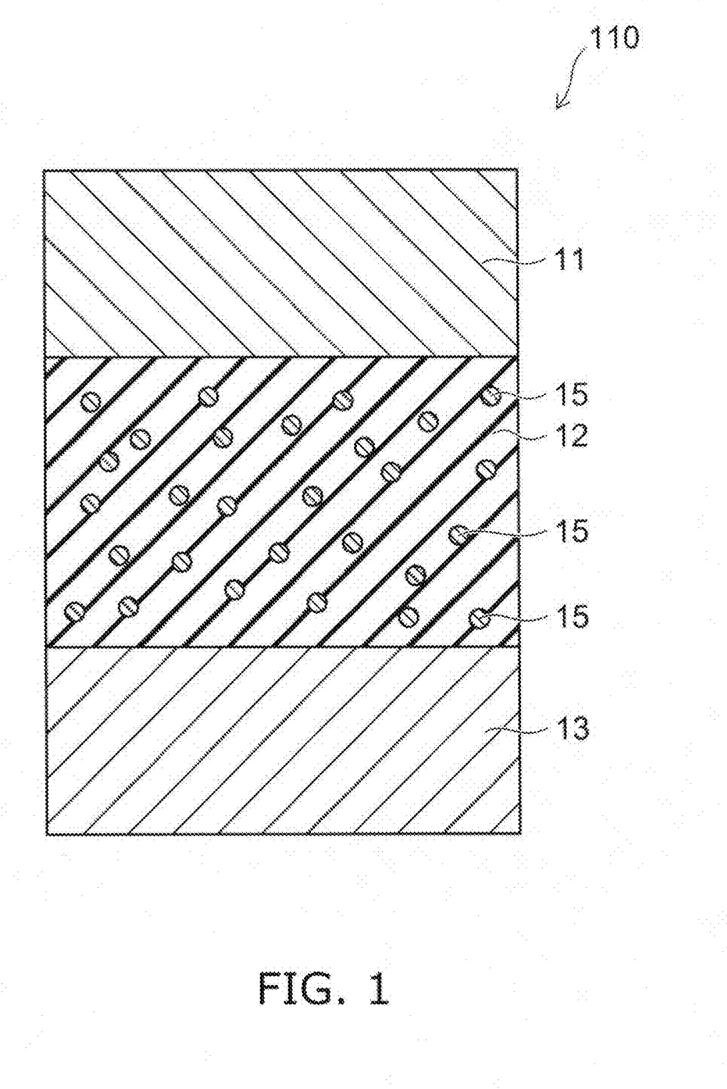
FIG. 1 is a schematic sectional view illustrating the configuration of a nonvolatile memory device according to a first embodiment.

FIG. 1 is a schematic sectional view illustrating the configuration of a nonvolatile memory device according to a first embodiment.

As shown in FIG. 1, the nonvolatile memory device 110 according to this embodiment includes a first electrode 11, a second electrode 13, and a variable resistance layer 12. The variable resistance layer 12 is provided between the first electrode 11 and the second electrode 13. The variable resistance layer 12 contains impurity based on a nonmetallic element. The nonvolatile memory device 110 is a resistive random access memory element, which changes the resistance of the variable resistance layer 12 in response to application of voltage between the first electrode 11 and the second electrode 13.

In the nonvolatile memory device 110, in response to write voltage application, the resistance state of the variable resistance layer 12 transitions to a low resistance state. In the nonvolatile memory device 110, in response to erase voltage application, the resistance state of the variable resistance layer 12 transitions to a high resistance state. The nonvolatile memory device 110 is a resistance change element subjected to what is called bipolar operation in which the direction of write voltage application and the direction of erase voltage application are opposite to each other.

Here, the write, erase, and read operations in the nonvolatile memory device 110 are described.

The write operation is performed by applying a positive voltage to the first electrode 11 relative to the second electrode 13. By this write operation, the variable resistance layer 12 transitions to the low resistance state. The low resistance state is a state having a lower resistance than the high resistance state.

The erase operation is performed by applying a positive voltage to the second electrode 13 relative to the first electrode 11. By this erase operation, the variable resistance layer 12 transitions to the high resistance state. The high resistance state is a state having a higher resistance than the low resistance state.

The read operation is performed by applying a voltage in the same direction as the write operation. That is, a positive voltage relative to the second electrode 13 is applied to the first electrode 11. However, the read operation may be performed by applying a positive voltage to the second electrode 13 relative to the first electrode 11.

For the material of the variable resistance layer 12, an elemental semiconductor or an oxide thereof is used. Specifically, for the material of the variable resistance layer 12, Si (silicon), Ge (germanium), silicon germanium (SiGe), silicon oxide, germanium oxide, silicon germanium oxide and the like are used. These materials may be in either the amorphous state or the crystallized state.

The variable resistance layer 12 may be in a monolayer structure using one of the above materials, or a multilayer structure in which at least two of the above materials are stacked.

The film thickness of the variable resistance layer 12 is typically approximately 1 nanometer (nm) or more and 100 nm or less. The operating voltage of the nonvolatile memory device 110 depends on the film thickness of the variable resistance layer 12. Preferably, the variable resistance layer 12 has a thinner film thickness. More preferably, the film thickness of the variable resistance layer 12 is e.g. approximately 1 nm or more and 20 nm or less.

For the material of the first electrode 11, an easily ionizable metal is used. Specifically, for the material of the first electrode 11, at least one selected from the group consisting of silver (Ag), copper (Cu), cobalt (Co), nickel (Ni), aluminum (Al), titanium (Ti), and gold (Au) is used.

For the material of the second electrode 13, for instance, a semiconductor doped with impurity at high concentration and an inactive metal being not easily ionizable are used. Specifically, for the material of the second electrode 13, a semiconductor such as Si, Ge, and SiGe doped with impurity at high concentration, and an inactive metal being not easily ionizable such as platinum (Pt), titanium nitride (TiN), tungsten (W), molybdenum (Mo), and tantalum (Ta) are used.

In the nonvolatile memory device 110, the variable resistance layer 12 contains impurity of a nonmetallic element. The nonmetallic element contained in the variable resistance layer 12 is an elemental species forming a stable compound with the metal material species of the first electrode 11. Examples of this elemental species are group 16 elements including oxygen (O), sulfur (S), selenium (Se), and tellurium (Te), and group 17 elements including fluorine (F), chlorine (Cl), bromine (Br), and iodine (I). The impurity added to the variable resistance layer 12 includes one or more of these nonmetallic elements.

Figure 2A:
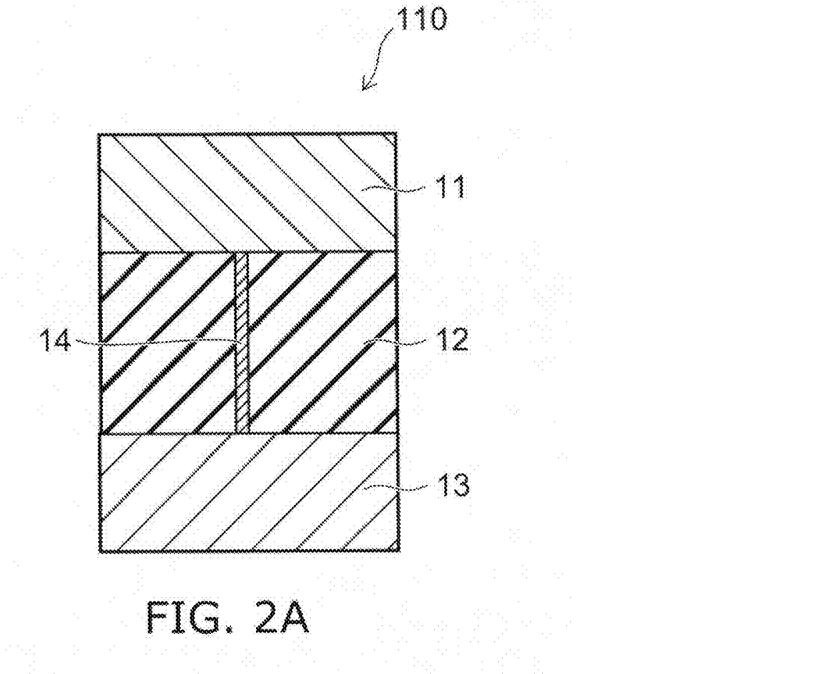
FIGS. 2A and 2B are schematic views illustrating data retention characteristics.
Figure 2B:
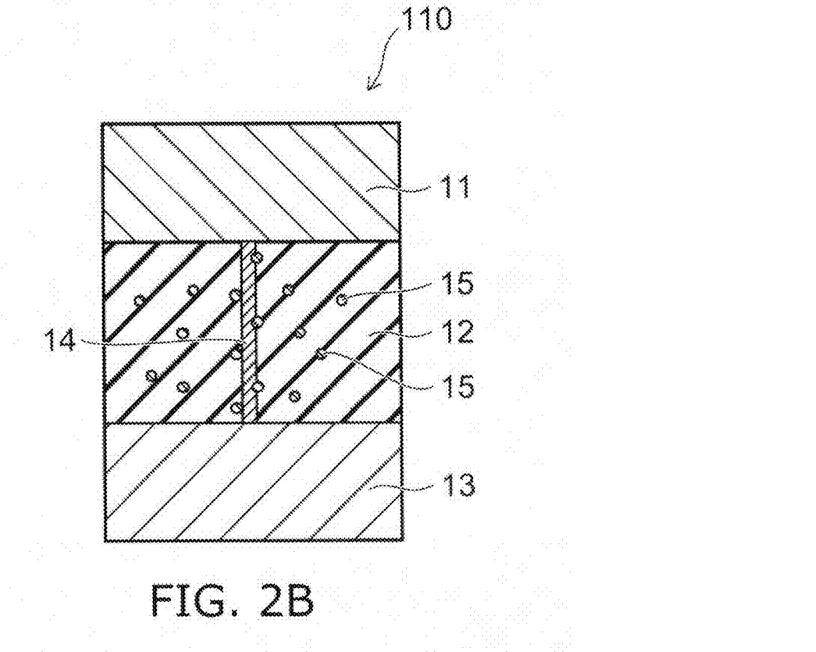

FIGS. 2A and 2B are schematic views illustrating data retention characteristics.

FIG. 2A shows a state in which a conductive filament is generated. FIG. 2B shows a state of impurity.

As an example, the variable resistance layer 12 is made of amorphous silicon. The first electrode 11 is made of Ag. The second electrode 13 is a p-type silicon layer doped with impurity at high concentration.

As shown in FIG. 2A, upon application of a write voltage to the nonvolatile memory device 110, Ag of the first electrode 11 is ionized and migrates toward the variable resistance layer 12. In the variable resistance layer 12, a conductive filament 14 is formed. When the conductive filament 14 is formed, the variable resistance layer 12 is changed to the low resistance state.

Based on this resistance change model, the retention characteristics of the write state (low resistance state of the variable resistance layer 12) are determined by the stability of the conductive filament 14 of Ag generated in the variable resistance layer 12.

As shown in FIG. 2B, by the chemical modification of adding impurity 15 of a nonmetallic element to the variable resistance layer 12, the conductive filament 14 is stabilized. In particular, as a nonmetallic impurity element, an element which can form a stable compound by making a chemical bond to the material of the first electrode 11 (Ag in the above example) is used. Thus, good data retention characteristics are achieved. For this reason, in order to realize superior data retention characteristics, as an elemental species of the impurity 15, it is preferable to select an element making a strong chemical bond to the metal material element forming the conductive filament 14, or an element whose compound formed with the material of the first electrode 11 has a low standard free energy of formation.

Next, a memory unit of the cross-point structure is described.

Figure 3A:
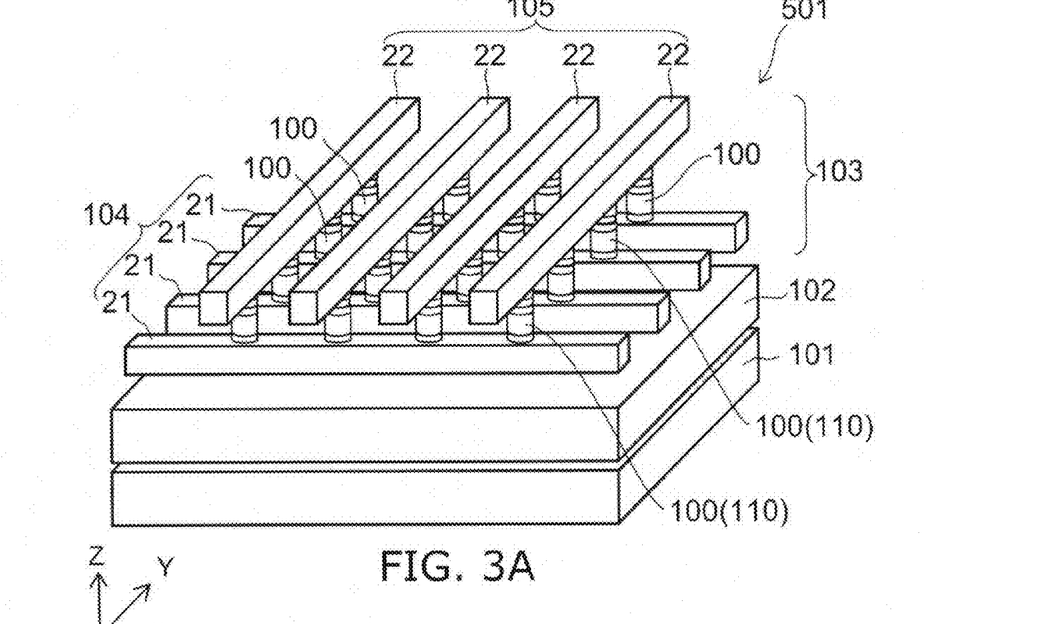
FIGS. 3A and 3B are schematic perspective views illustrating the memory unit of the cross-point structure.
Figure 3B:
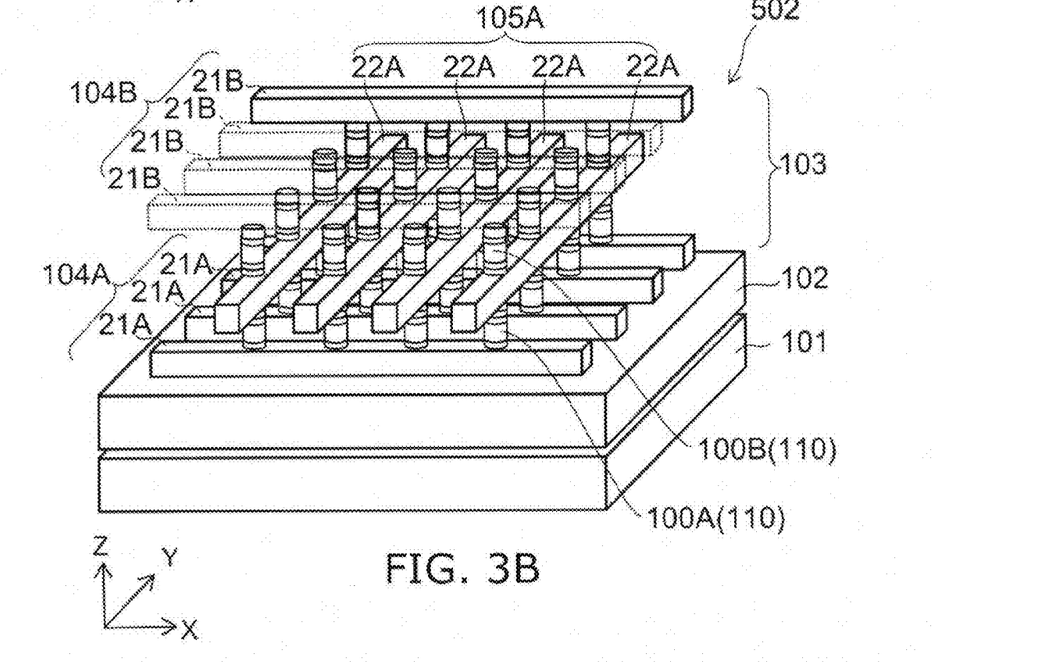

FIGS. 3A and 3B are schematic perspective views illustrating the memory unit of the cross-point structure.

FIG. 3A shows an example configuration of a single-stage memory unit 501. FIG. 3B shows an example configuration of a multi-stage memory unit 502.

As shown in FIG. 3A, the memory unit 501 includes a silicon substrate 101. In an upper portion of the silicon substrate 101, a driving circuit (not shown) is formed. On the silicon substrate 101, an interlayer insulating film 102 made of e.g. silicon oxide is provided so as to bury the driving circuit.

On the interlayer insulating film 102, a memory cell section 103 of the cross-point structure is provided. The memory cell section 103 includes a word line wiring layer 104 including a plurality of word lines 21, a bit line wiring layer 105 including a plurality of bit lines 22, and a plurality of functional layers 100 provided at the cross points thereof.

The functional layer 100 includes the nonvolatile memory device 110 according to this embodiment. The first electrode 11 in the nonvolatile memory device 110 is provided on e.g. the bit line 22 side. The second electrode 13 in the nonvolatile memory device 110 is provided on e.g. the word line 21 side. For instance, the second electrode 13, the variable resistance layer 12, and the first electrode 11 are stacked in this order from the word line 21 toward the bit line 22.

Each of the plurality of word lines 21 extends in one direction (X direction) parallel to the upper surface of the silicon substrate 101. Each of the plurality of bit lines 22 extends in a direction (e.g., Y direction orthogonal to the X direction), which is parallel to the upper surface of the silicon substrate 101 and crosses the X direction. The word line wiring layer 104 is spaced from the bit line wiring layer 105 in the Z direction orthogonal to the upper surface of the silicon substrate 101.

The word line 21 and the bit line 22 are formed from e.g. W. The word lines 21 are not in contact with each other. The bit lines 22 are not in contact with each other. The word line 21 and the bit line 22 are not in contact with each other.

At the nearest point of each word line 21 and each bit line 22, a functional layer 100 is provided. The functional layer 100 is formed like a pillar between the word line 21 and the bit line 22. One functional layer 100 constitutes one memory cell. A memory cell is placed at each nearest point of the word line 21 and the bit line 22. Thus, the memory unit 501 has a cross-point structure.

In the memory unit 501 shown in FIG. 3A, a monolayer memory cell section 103 is shown. However, the memory cell section 103 may be configured in multiple layers.

FIG. 3B shows another cross-point structure. In the structure shown in FIG. 3B, the electrode (bit line 22A in FIG. 3B) is shared by the upper and lower functional layers 100.

More specifically, as shown in FIG. 3B, in an upper portion of the silicon substrate 101, a driving circuit (not shown) is formed. On the silicon substrate 101, an interlayer insulating film 102 made of e.g. silicon oxide is provided so as to bury the driving circuit.

On the interlayer insulating film 102, a memory cell section 103 of the cross-point structure is provided. The memory cell section 103 includes a first word line wiring layer 104A including a plurality of word lines 21A, a first bit line wiring layer 105A including a plurality of bit lines 22A, and a plurality of functional layers 100A provided at the cross points thereof. This functional layer 100A includes the nonvolatile memory device 110 according to this embodiment.

Furthermore, the memory cell section 103 includes a second word line wiring layer 104B including a plurality of word lines 21B, and a plurality of functional layers 100B provided at the cross points of the second word line wiring layer 104B and the first bit line wiring layer 105A. This functional layer 100B includes the nonvolatile memory device 110 according to this embodiment.

In the example configuration shown in FIG. 3B, the upper and lower functional layers 100 share the first bit line wiring layer 105A provided therebetween. Furthermore, the layer structure of the functional layer 100B is vertically inverted from the layer structure of the functional layer 100A. For instance, in the functional layer 100A, the second electrode 13, the variable resistance layer 12, and the first electrode 11 are stacked in this order from the word line 21A toward the bit line 22A. In the functional layer 100B, the second electrode 13, the variable resistance layer 12, and the first electrode 11 are stacked in this order from the word line 21B toward the bit line 22A.

In FIG. 3B, an example including two functional layers 100A and 100B has been shown. However, more functional layers 100 may be vertically stacked. In this case, word lines 21 and bit lines 22 are vertically and alternately stacked, and a functional layer 100 is placed at each cross point between the upper and lower word line 21 and bit line 22. In the vertically adjacent functional layers 100, the layer structure is stacked in the order opposite to each other.

Next, a method for manufacturing the nonvolatile memory device 110 is described.

Figure 4:
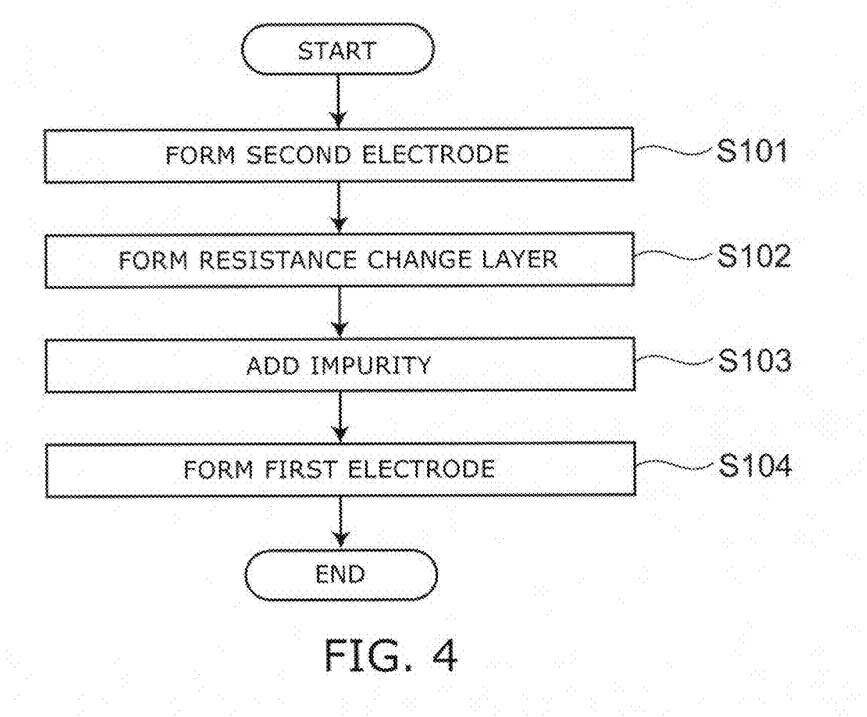
FIG. 4 is a flow chart illustrating the method for manufacturing a nonvolatile memory device.

FIG. 4 is a flow chart illustrating the method for manufacturing a nonvolatile memory device.

The method for manufacturing the nonvolatile memory device 110 includes the steps of forming a second electrode 13 (step S101), forming a variable resistance layer 12 on the second electrode 13 (step S102), adding impurity 15 of a nonmetallic element to the variable resistance layer 12 (step S103), and forming a first electrode 11 on the variable resistance layer 12 (step S104).

The impurity 15 used in the step of adding impurity 15 (step S103) is at least one selected from the group consisting of O, S, Se, Te, F, Cl, Br, and I.

Figure 5:
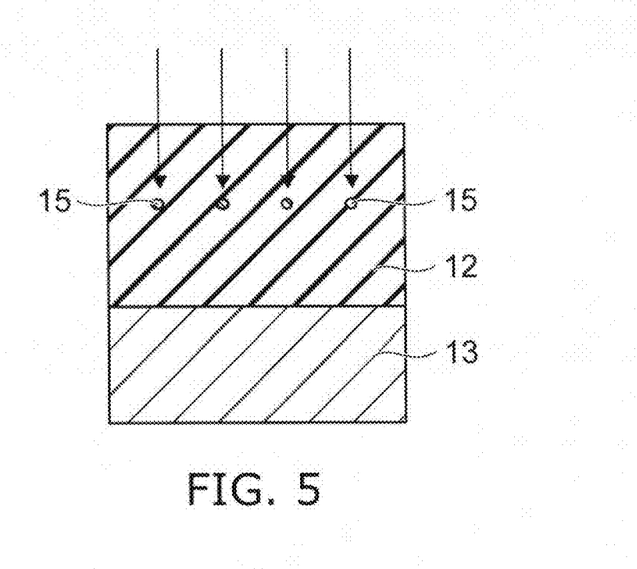
Figure 6A:
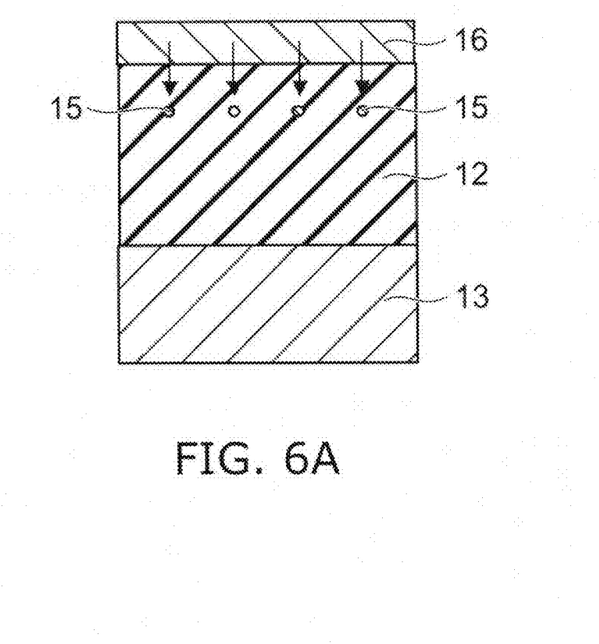
Figure 6B:
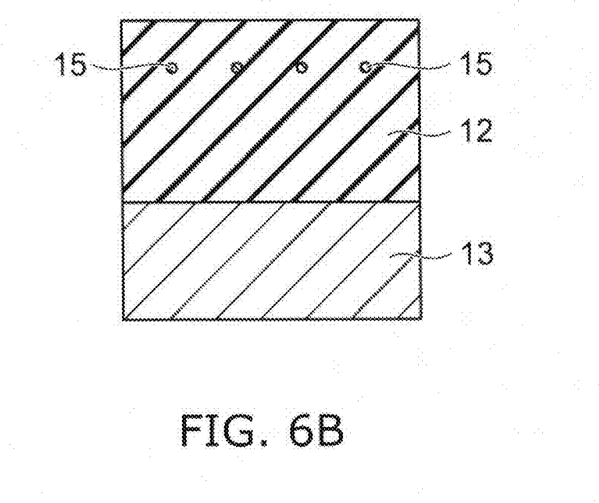

FIGS. 5 to 6B are schematic sectional views illustrating the method for manufacturing a nonvolatile memory device.

As described before, the variable resistance layer 12 contains impurity 15 of a nonmetallic element. FIG. 5 shows an example of adding a nonmetallic element by ion implantation. First, a variable resistance layer 12 is formed on the second electrode 13. The variable resistance layer 12 is stacked on the second electrode 13.

After the variable resistance layer 12 is stacked, impurity 15 of a nonmetallic element is ion implanted into the variable resistance layer 12. By adjusting the dose and the acceleration energy, the concentration and distribution of the nonmetallic element in the variable resistance layer 12 are controlled. Besides ion implantation, the nonmetallic element may be added to the variable resistance layer 12 by the technique of plasma doping using gas plasma containing impurity. In plasma doping, a shallow concentration profile into the variable resistance layer 12 is realized.

FIGS. 6A and 6B show an example of adding a nonmetallic element by diffusion. First, as shown in FIG. 6B, a variable resistance layer 12 is formed on the second electrode 13. Next, a material film 16 containing a nonmetallic element is stacked on the variable resistance layer 12.

Then, by e.g. heat treatment, the nonmetallic element is diffused from the film 16 into the variable resistance layer 12. Then, the material film 16 is removed by e.g. chemical treatment or dry etching. Thus, as shown in FIG. 6B, the variable resistance layer 12 diffused with the nonmetallic element is formed. By adjusting the heat treatment temperature and heat treatment time, the impurity concentration in the variable resistance layer 12 is controlled.

After the impurity 15 is implanted into the variable resistance layer 12, a first electrode 11 is formed on the variable resistance layer 12. The first electrode 11 is stacked on the variable resistance layer 12. Thus, the nonvolatile memory device 110 is completed.

In the nonvolatile memory device 110 according to this embodiment, the impurity element added to the variable resistance layer 12 enhances the stability of the conductive filament 14. This improves the data retention characteristics of the nonvolatile memory device 110.

Next, focusing on the combination of the electrode material and the nonmetallic element, specific examples are described.

Second Embodiment

The second embodiment shows an example of using Ag for the material of the electrode on the side of being ionized to form a conductive filament 14. In an example of the nonvolatile memory device 110 according to this embodiment, the first electrode 11 is made of Ag. The variable resistance layer 12 is made of amorphous silicon. The second electrode is a p-type silicon layer doped with impurity at high concentration. In this embodiment, for the nonmetallic element added to the variable resistance layer 12, an elemental species forming a stable compound with Ag, such as S and Cl, is used.

Figure 7:
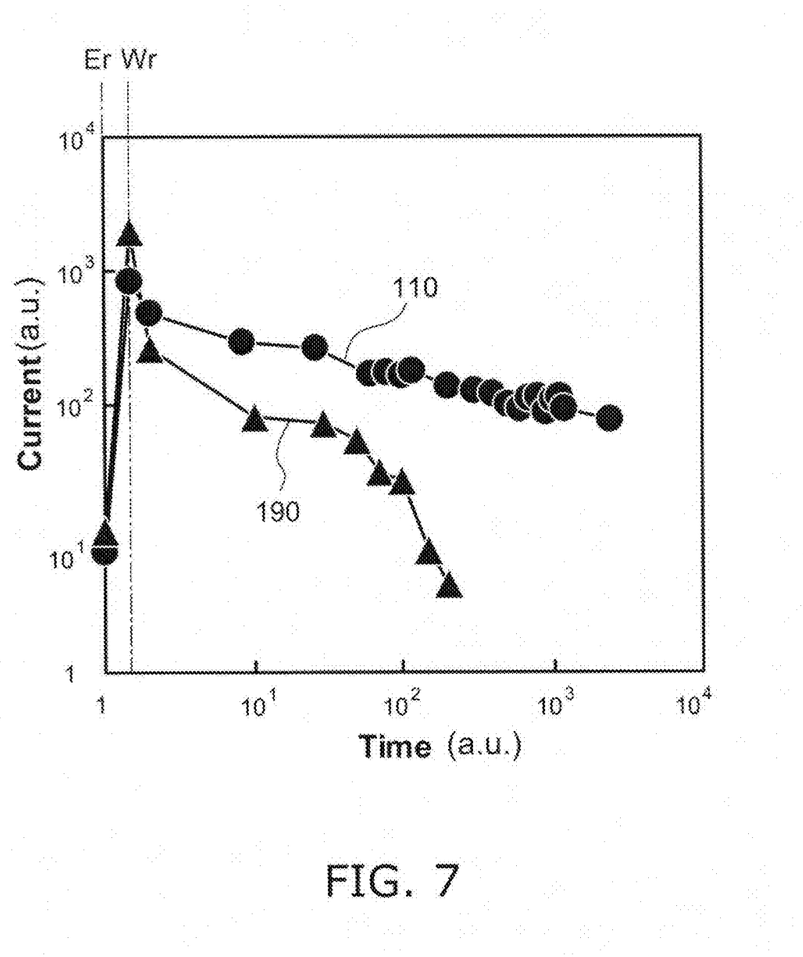
FIG. 7 shows an evaluation result of data retention characteristics.

FIG. 7 shows an evaluation result of data retention characteristics.

FIG. 7 shows an evaluation result of data retention characteristics in a prototype of the nonvolatile memory device 110. In FIG. 7, the horizontal axis represents time (logarithmic scale in arbitrary units). The vertical axis represents the value of current flowing in the variable resistance layer 12 (logarithmic scale in arbitrary units). In FIG. 7, from the erase state (Er in the figure), the amorphous silicon of the variable resistance layer 12 is changed to the low resistance state by voltage application (write operation, Wr in the figure). Then, with the voltage turned off, FIG. 7 shows the transition of the value of current flowing in the device over time. The transition to the low resistance state is performed by applying a positive voltage to the first electrode 11 relative to the second electrode 13. In the nonvolatile memory device 110, the elemental species of the impurity 15 added to the variable resistance layer 12 is sulfur.

Furthermore, FIG. 7 also shows the data retention characteristics of a nonvolatile memory device 190 according to a reference example. In the nonvolatile memory device 190, the variable resistance layer 12 is not doped with impurity 15 (e.g., S).

As shown in FIG. 7, in the nonvolatile memory device 110 with the variable resistance layer 12 (amorphous silicon)

doped with sulfur, the rate of decrease of current value over time after writing is smaller than in the nonvolatile memory device 190 not doped with S. That is, the data retention characteristics of the nonvolatile memory device 110 are superior to the data retention characteristics of the nonvolatile memory device 190.

Figure 8:
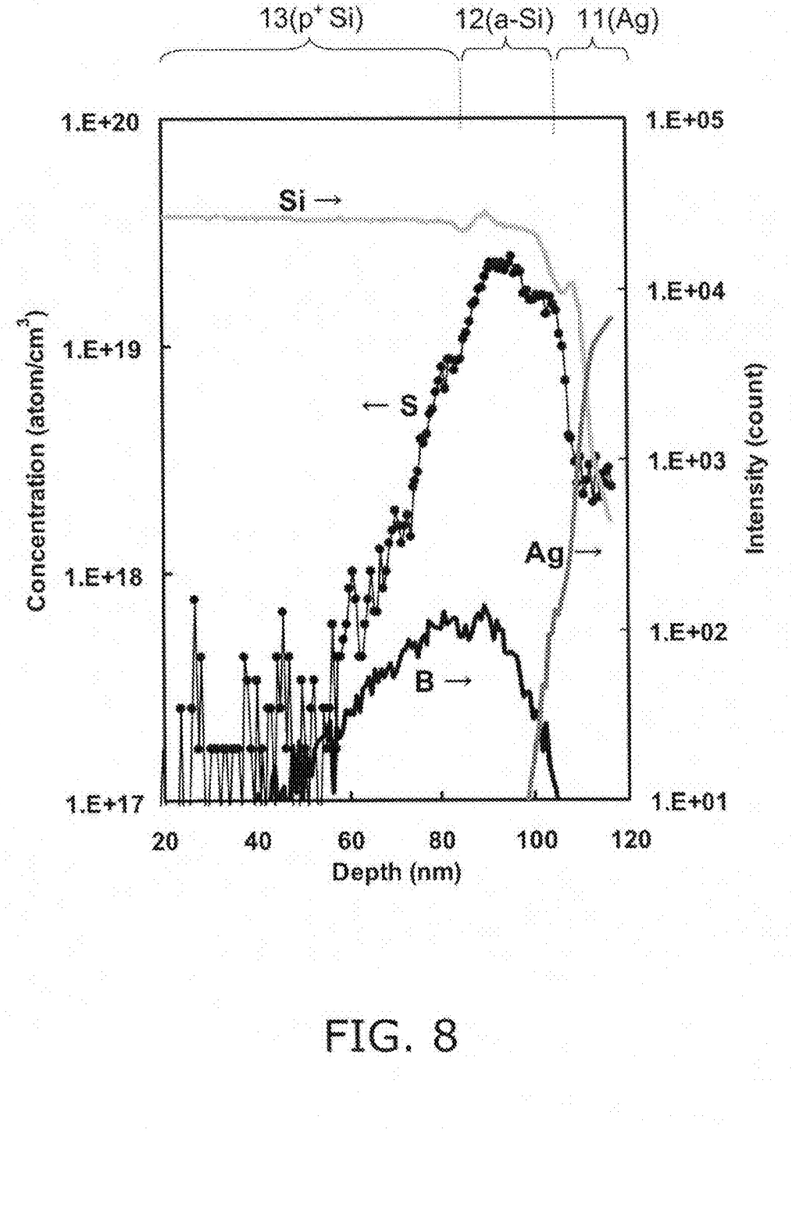
FIG. 8 shows an impurity concentration distribution.

FIG. 8 shows an impurity concentration distribution.

FIG. 8 shows the impurity concentration of the nonvolatile memory device 110 evaluated in FIG. 7 according to secondary ion mass spectroscopy (SIMS). In FIG. 8, the horizontal axis represents depth, and the vertical axis represents impurity concentration. The horizontal axis (depth) shown in FIG. 8 represents the depth in the direction from the second electrode 13 (p-type silicon layer doped with impurity at high concentration) toward the first electrode 11 (Ag).

The peak concentration of S in the variable resistance layer 12 (amorphous silicon) is approximately $2 \times 10^{19}$ atom/$cm^3$. In the case where the impurity concentration in the variable resistance layer 12 is set to approximately $2 \times 10^{19}$ atom/$cm^3$, a clear improvement effect is obtained in the data retention characteristics of the nonvolatile memory as shown in FIG. 7.

Figure 9:
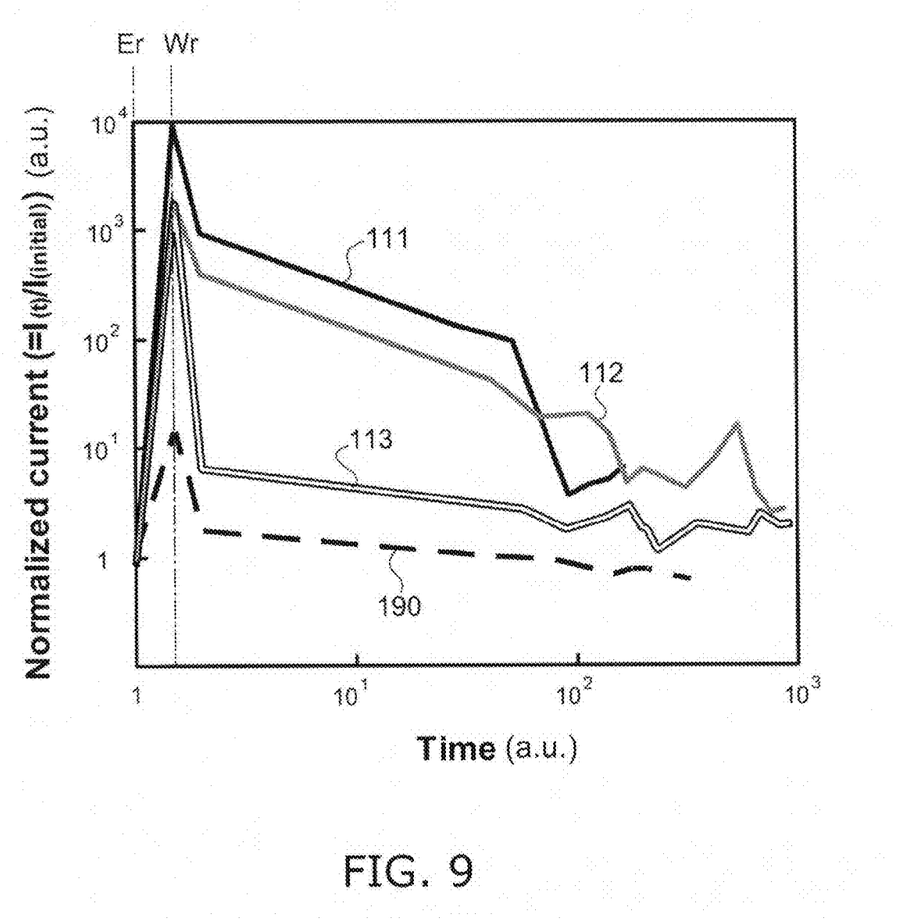
FIG. 9 illustrates data retention characteristics depending on the elemental species of impurity added to the variable resistance layer.

FIG. 9 illustrates data retention characteristics depending on the elemental species of impurity added to the variable resistance layer.

FIG. 9 shows the dependence of data retention characteristics on the elemental species. In FIG. 9, the horizontal axis represents time (logarithmic scale in arbitrary units). The vertical axis represents the value of current flowing in the variable resistance layer 12 (logarithmic scale in arbitrary units). For comparison between different elemental species, the current value on the vertical axis is a normalized value (I(t)/I(initial)) in which the current value after time t (I(t)) for elemental species is normalized by the current value in the erase state (I(initial)).

In FIG. 9, from the erase state (Er in the figure), the amorphous silicon of the variable resistance layer 12 is changed to the low resistance state by voltage application (write operation, Wr in the figure). Then, with the voltage turned off, FIG. 9 shows the transition of the value of current flowing in the device over time. For the elemental species of the added impurity, three elemental species are used, i.e., S of group 16, Cl of group 17, and Ar of group 18. The variable resistance layer 12 of a nonvolatile memory device 111 is doped with S. The variable resistance layer 12 of a nonvolatile memory device 112 is doped with Cl. The variable resistance layer 12 of a nonvolatile memory device 113 is doped with Ar. The variable resistance layer 12 of the nonvolatile memory device 190 is not doped with impurity.

As shown in FIG. 9, in the nonvolatile memory devices 111 and 112, a clear improvement of the data retention characteristics is obtained compared with the nonvolatile memory device 190. In the nonvolatile memory device 113, the data retention characteristics are not improved compared with the nonvolatile memory devices 111 and 112. From the above results, high data retention characteristics are achieved by, as in this embodiment, impurity doping of the variable resistance layer 12 with group 16 element S or group 17 element Cl, which is an element forming a stable compound with Ag.

For the nonmetallic element of the impurity 15 added to the variable resistance layer 12, besides S and Cl described above, F, Br, I, O, Se, and Te may also be used. These elements are preferable in view of the strength of bonding between elements and the standard free energy of formation of the compound. More favorable improvement effect of data retention characteristics is expected by selecting one of S, Cl, and Br as the impurity 15.

Based on the SIMS analysis result, a preferable impurity element concentration in the variable resistance layer 12 is approximately $1 \times 10^{18}$ atom/$cm^3$ or more and $5 \times 10^{20}$ atom/$cm^3$ or less. The impurity element concentration in the variable resistance layer 12 lower than $1 \times 10^{18}$ atom/$cm^3$ may result in an insufficient chemical modification effect. The impurity element concentration in the variable resistance layer 12 higher than $5 \times 10^{20}$ atom/$cm^3$ may result in alteration of film characteristics such as increased leakage in the variable resistance layer 12 due to process damage. For the material of the variable resistance layer 12 and the second electrode 13, materials other than the material mentioned in the first embodiment may also be used.

Third Embodiment

The above second embodiment has described an example structure of using Ag for the material of the first electrode 11 on the side of being ionized to form a conductive filament 14. The third embodiment describes an example device structure of using Cu for the first electrode 11.

In the case of using Cu for the material of the first electrode 11, as an example, the material of the variable resistance layer 12 is amorphous silicon, and the material of the second electrode 13 is TiN. The nonmetallic element added to the variable resistance layer 12 is preferably an element forming a stable compound with Cu. In particular, as described above, in view of the strength of bonding between elements and the standard free energy of formation, it is desirable to preferentially use O, Cl, and Br. For the nonmetallic element added to the variable resistance layer 12, F, I, S, Se, and Te may also be used. For reasons similar to those in the second embodiment, a preferable impurity element concentration in the variable resistance layer 12 is approximately $1 \times 10^{18}$ atom/$cm^3$ or more and $5 \times 10^{20}$ atom/$cm^3$ or less. For the material of the variable resistance layer 12 and the second electrode 13, materials other than the material mentioned in the first embodiment may also be used.

Fourth Embodiment

The above second embodiment has described an example structure of using Ag for the material of the first electrode 11 on the side of being ionized to form a conductive filament 14. The fourth embodiment describes an example device structure of using Co for the first electrode 11.

In the case of using Co for the material of the first electrode 11, as an example, the material of the variable resistance layer 12 is amorphous silicon, and the material of the second electrode 13 is W. The nonmetallic element added to the variable resistance layer 12 is preferably an element forming a stable compound with Co. In particular, as described above, in view of the strength of bonding between elements and the standard free energy of formation, it is desirable to preferentially use O and Cl. For the nonmetallic element added to the variable resistance layer 12, F, Br, I, S, Se, and Te may also be used instead of O and Cl. For reasons similar to those in the second embodiment, a preferable impurity element concentration in the variable resistance layer 12 is approximately $1 \times 10^{18}$ atom/$cm^3$ or more and $5 \times 10^{20}$ atom/$cm^3$ or less. For the material of the variable resistance layer 12 and the electrode 13, materials other than the material mentioned in the first embodiment may also be used.

Fifth Embodiment

The above second embodiment has described an example structure of using Ag for the material of the first electrode 11 on the side of being ionized to form a conductive filament 14. The fifth embodiment describes an example device structure of using Ni for the first electrode 11.

In the case of using Ni for the material of the first electrode 11, as an example, the material of the variable resistance layer 12 is silicon oxide film, and the material of the second electrode 13 is Ta. The nonmetallic element added to the variable resistance layer 12 is preferably an element forming a stable compound with Ni. In particular, as described above, in view of the strength of bonding between elements and the standard free energy of formation, it is desirable to preferentially use F and Cl. For the nonmetallic element added to the variable resistance layer 12, Br, I, O, S, Se, and Te may also be used instead of F and Cl. For reasons similar to those in the second embodiment, a preferable impurity element concentration in the variable resistance layer 12 is approximately $1 \times 10^{18}$ atom/cm$^3$ or more and $5 \times 10^{20}$ atom/cm$^3$ or less. For the material of the variable resistance layer 12 and the electrode 13, materials other than the material mentioned in the first embodiment may also be used.

Sixth Embodiment

The above second embodiment has described an example structure of using Ag for the material of the first electrode 11 on the side of being ionized to form a conductive filament 14. The sixth embodiment describes an example device structure of using Al for the first electrode 11.

In the case of using Al for the material of the first electrode 11, as an example, the material of the variable resistance layer 12 is Si, and the material of the second electrode 13 is Pt. The nonmetallic element added to the variable resistance layer 12 is preferably an element forming a stable compound with Al. In particular, as described above, in view of the strength of bonding between elements and the standard free energy of formation, it is desirable to preferentially use O, F, and Cl. For the nonmetallic element added to the variable resistance layer 12, Br, I, S, Se, and Te may also be used instead of O, F, and Cl. For reasons similar to those in the second embodiment, a preferable impurity element concentration in the variable resistance layer 12 is approximately $1 \times 10^{18}$ atom/cm$^3$ or more and $5 \times 10^{20}$ atom/cm$^3$ or less. For the material of the variable resistance layer 12 and the electrode 13, materials other than the material mentioned in the first embodiment may also be used.

Seventh Embodiment

The above second embodiment has described an example structure of using Ag for the material of the first electrode 11 on the side of being ionized to form a conductive filament 14. The seventh embodiment describes an example device structure of using Ti for the first electrode 11.

In the case of using Ti for the material of the first electrode 11, as an example, the material of the variable resistance layer 12 is Ge, and the second electrode 13 is made of W. The nonmetallic element added to the variable resistance layer 12 is preferably an element forming a stable compound with Ti. In particular, as described above, in view of the strength of bonding between elements and the standard free energy of formation, it is desirable to preferentially use O, Cl, and Br. For the nonmetallic element added to the variable resistance layer 12, F, I, S, Se, and Te may also be used instead of O, Cl, and Br. For reasons similar to those in the second embodiment, a preferable impurity element concentration in the variable resistance layer 12 is approximately $1 \times 10^{18}$ atom/cm$^3$ or more and $5 \times 10^{20}$ atom/cm$^3$ or less. For the material of the variable resistance layer 12 and the electrode 13, materials other than the material mentioned in the first embodiment may also be used.

Eighth Embodiment

Figure 10:
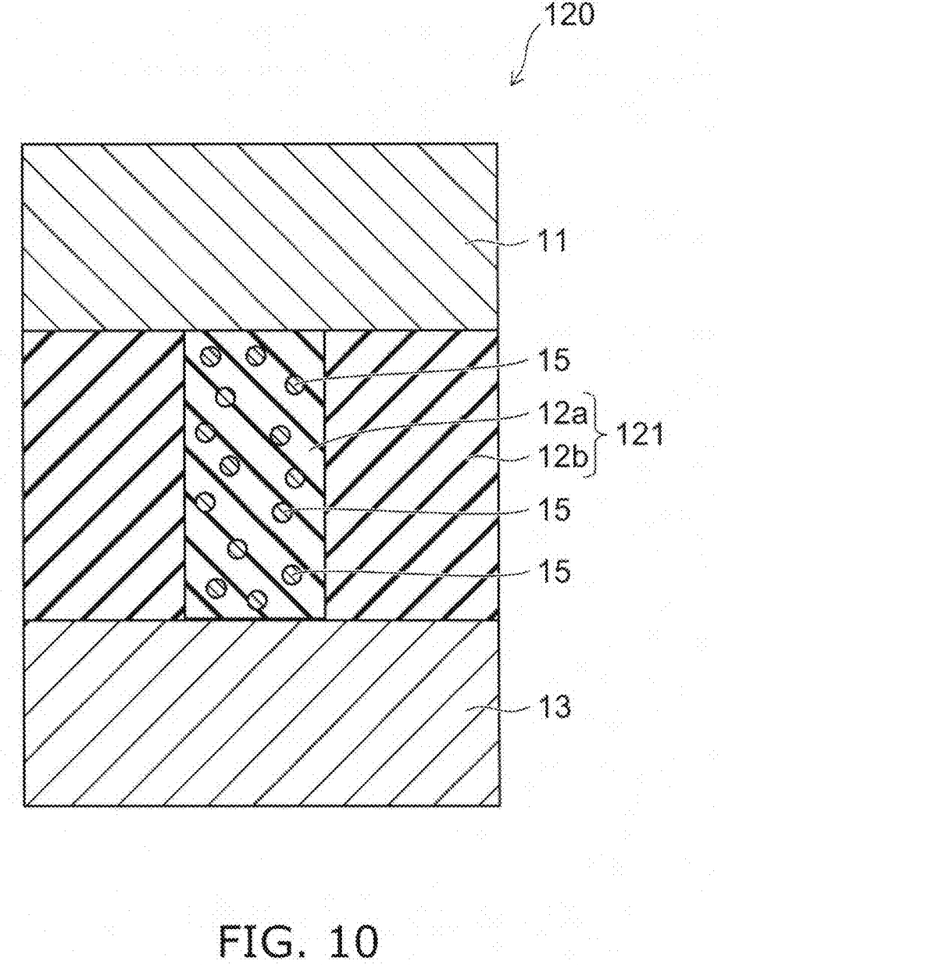
FIG. 10 is a schematic sectional view illustrating the configuration of a nonvolatile memory device according to an eighth embodiment.

FIG. 10 is a schematic sectional view illustrating the configuration of a nonvolatile memory device according to an eighth embodiment.

As shown in FIG. 10, the nonvolatile memory device 120 according to this embodiment includes a first electrode 11, a second electrode 13, and a variable resistance layer 121. The variable resistance layer 121 is provided between the first electrode 11 and the second electrode 13.

The variable resistance layer 121 includes a first section 12a and a second section 12b. The first section 12a contains impurity based on a nonmetallic element. The second section 12b does not substantially contain impurity based on a nonmetallic element. Not substantially containing impurity refers to not intentionally containing impurity. The second section 12b may unintentionally contain impurity based on the nonmetallic element contained in the first section 12a. The concentration of impurity of the nonmetallic element in the first section 12a is locally high in the entire variable resistance layer 121. The concentration of impurity based on the nonmetallic element contained in the first section 12a is, e.g., atom/cm$^3$ or more. The concentration of impurity based on the nonmetallic element contained in the second section 12b is e.g. less than $1 \times 10^{18}$ atom/cm$^3$ (including 0).

For instance, the first section 12a is continuously provided between the first electrode 11 and the second electrode 13. For instance, the first section 12a is in contact with each of the first electrode 11 and the second electrode 13. If the first section 12a is continuously provided between the first electrode 11 and the second electrode 13, the conductive filament 14 formed in the variable resistance layer 121 can easily connect between the first electrode 11 and the second electrode 13.

The first section 12a does not necessarily need to be continuously provided between the first electrode 11 and the second electrode 13. The first section 12a may be spaced from the first electrode 11. The first section 12a may be spaced from the second electrode 13. By adjusting the distance between the first section 12a and the first electrode 11 and between the first section 12a and the second electrode 13, the write and erase characteristics of the nonvolatile memory device 120 are adjusted.

The write operation, erase operation, and read operation in the nonvolatile memory device 120 are similar to those in the nonvolatile memory device 110 according to the first embodiment.

The materials of the first electrode 11, the variable resistance layer 121, the nonmetallic elemental species added to the variable resistance layer 121, and the second electrode 13 in the nonvolatile memory device 120 are similar to the materials of the first electrode 11, the variable resistance layer 12, the nonmetallic elemental species added to the variable resistance layer 12, and the second electrode 13 in the nonvolatile memory device 110 according to the first embodiment, respectively.

In the nonvolatile memory device 120, a conductive filament 14 is formed only in the first section 12a inside the variable resistance layer 121.

Figure 11:
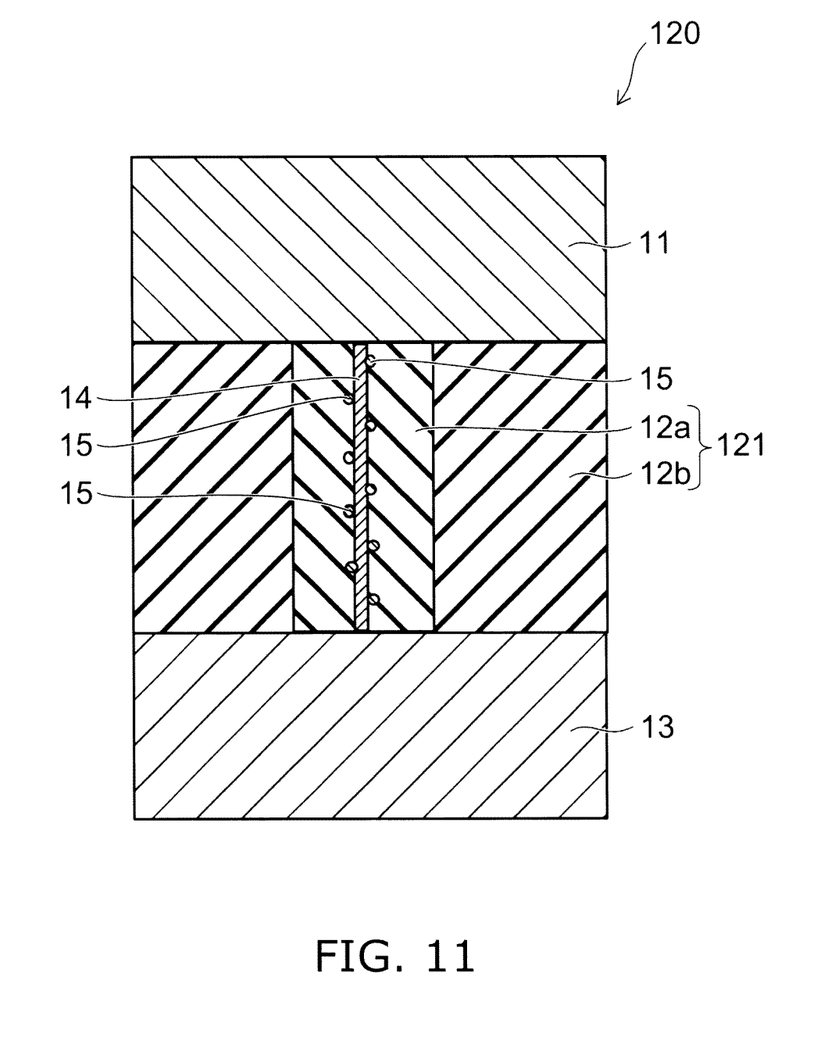
FIG. 11 is a schematic sectional view illustrating formation of a conductive filament.

FIG. 11 is a schematic sectional view illustrating formation of a conductive filament.

The variable resistance layer 121 includes a first section 12a doped with a nonmetallic element and a second section 12b not doped with a nonmetallic element. Upon application of a write voltage between the first electrode 11 and the second electrode 13, a conductive filament 14 is generated in the variable resistance layer 121. Here, the metallic element constituting the conductive filament 14 tends to make a chemical bond to the nonmetallic element added to the variable resistance layer 121. In the variable resistance layer 121, in the portion of high concentration of the nonmetallic element, i.e., in the first section 12a, a conductive filament 14 is preferentially generated. Thus, the location for generating a conductive filament 14 is set by the position of the first section 12a of the variable resistance layer 121.

In the nonvolatile memory device 120, the position for generating the conductive filament 14 is fixed when e.g. repeating the write operation and erase operation. This reduces variations in the repeated operation of write and erase. Furthermore, likewise, a similar impurity nonmetallic element distribution can be realized among a plurality of devices to reduce characteristics variations among the devices. In the nonvolatile memory device 120, stable memory operation with small characteristics variation among the devices is realized.

Figure 12A:
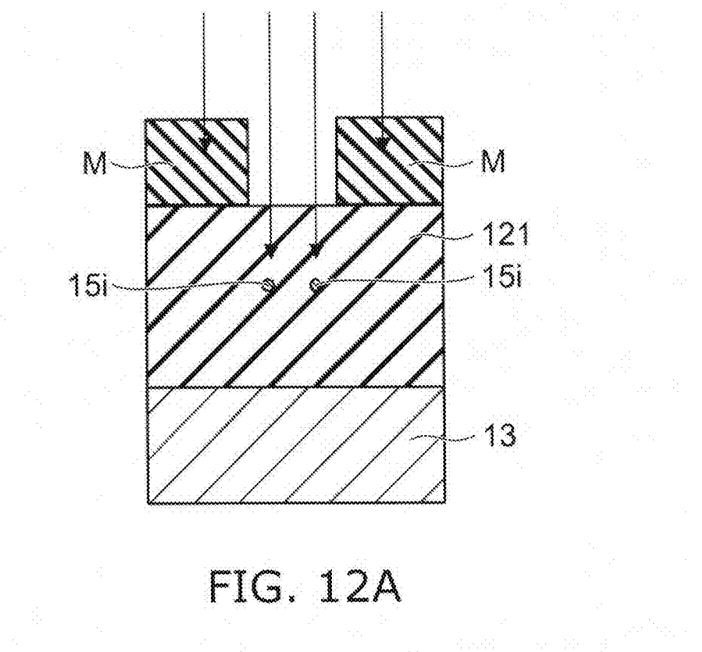
FIGS. 12A and 12B are schematic sectional views illustrating a method for manufacturing a variable resistance layer.
Figure 12B:
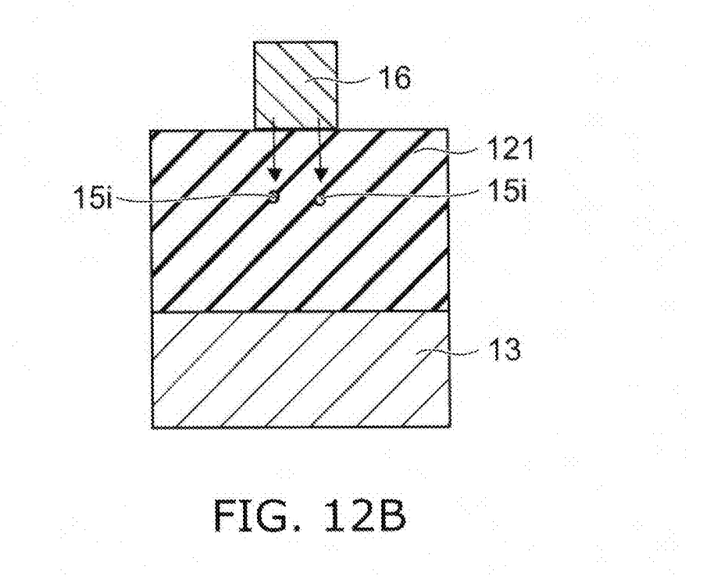

FIGS. 12A and 12B are schematic sectional views illustrating a method for manufacturing a variable resistance layer.

First, as shown in FIG. 12A, a variable resistance layer 121 is stacked on the second electrode 13. Next, a hard mask material is finely patterned on the variable resistance layer 121 to form a hard mask M. Then, a nonmetallic element 15i is ion implanted via the hard mask M. The nonmetallic element 15i may be implanted by plasma doping. Thus, as shown in FIG. 10, a variable resistance layer 121 including a first section 12a and a second section 12b is formed.

Besides the method for ion implanting the nonmetallic element 15i, the variable resistance layer 121 may be formed by impurity diffusion as shown in FIG. 12B. For instance, as shown in FIG. 12B, a material film 16 containing a nonmetallic element is formed on the variable resistance layer 121 and patterned so as to leave only a necessary portion. Next, by e.g. heat treatment, impurity diffusion is locally performed into the variable resistance layer 121 from the portion where the material film 16 is formed. Thus, as shown in FIG. 10, a variable resistance layer 121 including a first section 12a and a second section 12b is formed.

After the variable resistance layer 121 is formed by one of the methods, a first electrode 11 is formed on the variable resistance layer 121. Thus, the nonvolatile memory device 120 is completed.

By such a manufacturing method, a nonvolatile memory device 120 in which the position for generating a conductive filament 14 is set in the variable resistance layer 121 is formed.

As described above, the nonvolatile memory device according to the embodiments can improve data retention characteristics.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device, comprising:
   a first electrode including at least one element selected from the group consisting of Ag, Co, Ni, and Au;
   a second electrode; and
   a variable resistance layer provided between the first electrode and the second electrode,
   the variable resistance layer including a first region continuously provided between the first electrode and the second electrode, the first region comprising a first element and a second element,
   the first element including at least one of Si and Ge, and
   the second element including at least one selected from the group consisting of S, Se, Te, Cl, Br, and I,
   wherein the variable resistance layer further includes a second region,
   a second concentration of the second element included in the second region is less than a first concentration of the second element included in the first region, or the second region does not substantially contain the second element.

2. The device according to claim 1, wherein the first region includes at least one selected from the group consisting of Si, Ge, SiGe, silicon oxide, germanium oxide, and silicon germanium oxide.

3. The device according to claim 1, wherein
   a material of the first electrode is Ag, and
   the second element is at least one selected from the group consisting of S, Cl, and Br.

4. The device according to claim 1, wherein
   a material of the first electrode is Ag, and
   the second element is at least one selected from the group consisting of S.

5. The device according to claim 1, wherein
   a material of the first electrode is Cu, and
   the second element is at least one selected from the group consisting of Cl and Br.

6. The device according to claim 1, wherein
   a material of the first electrode is Co, and
   the second element is Cl.

7. The device according to claim 1, wherein
a material of the first electrode is Ni, and
the second element is Cl.

8. The device according to claim 1, wherein
a material of the first electrode is Al, and
the second element is Cl.

9. The device according to claim 1, wherein
a material of the first electrode is Ti, and
the second element is at least one selected from the group consisting of Cl and Br.

10. The device according to claim 1, wherein the variable resistance layer physically contacts the first electrode and the second electrode.

11. The device according to claim 1, wherein the second element is at least one of Cl, Br, and I.

12. The device according to claim 1, wherein a concentration of the second element included in the first region is not less than $1 \times 10^{18}$ atom/cm$^3$ and not more than $5 \times 10^{20}$ atom/cm$^3$.

13. The device according to claim 1, wherein the first concentration is not less than $1 \times 10^{18}$ atom/cm$^3$ and not more than $5 \times 10^{20}$ atom/cm$^3$ or less, and the second concentration is less than $1 \times 10^{18}$ atom/cm$^3$.

14. A nonvolatile memory device, comprising:
a first electrode including at least one element selected from the group consisting of Ag and Ni;
a second electrode; and
a variable resistance layer provided between the first electrode and the second electrode,
the variable resistance layer including a first region continuously provided between the first electrode and the second electrode, the first region comprising a first element and a second element,
the first element including at least one of Si and Ge, and
the second element including at least one selected from the group consisting of S, Se, Te, Cl, Br, and I,
wherein the variable resistance layer further includes a second region,
a second concentration of the second element included in the second region is less than a first concentration of the second element included in the first region, or the second region does not substantially contain the second element.

15. The device according to claim 14, wherein a concentration of the second element included in the first region is not less than $1 \times 10^{18}$ atom/cm$^3$ and not more than $5 \times 10^{20}$ atom/cm$^3$ or less.

* * * * *